(12) United States Patent
Hayashi et al.

(10) Patent No.: US 8,003,920 B2
(45) Date of Patent: Aug. 23, 2011

(54) SUBSTRATE PROCESSING APPARATUS

(75) Inventors: Daisuke Hayashi, Nirasaki (JP); Morihiro Takanashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 878 days.

(21) Appl. No.: 12/020,644

(22) Filed: Jan. 28, 2008

(65) Prior Publication Data

US 2008/0210680 A1   Sep. 4, 2008

Related U.S. Application Data

(60) Provisional application No. 60/911,714, filed on Apr. 13, 2007.

(30) Foreign Application Priority Data

Jan. 31, 2007   (JP) ................. 2007-021017

(51) Int. Cl.
*H01L 21/683*   (2006.01)
*H05B 3/20*   (2006.01)
*F27B 5/06*   (2006.01)

(52) U.S. Cl. ............. 219/390; 219/392; 219/444.1; 118/728

(58) Field of Classification Search .......... None
See application file for complete search history.

(56) References Cited

U.S. PATENT DOCUMENTS

| 5,848,670 | A | * | 12/1998 | Salzman | 187/272 |
| 6,196,532 | B1 | * | 3/2001 | Otwell | 269/21 |
| 2004/0187791 | A1 | * | 9/2004 | Busse et al. | 118/728 |
| 2008/0179006 | A1 | * | 7/2008 | Tahara et al. | 156/345.29 |
| 2008/0210680 | A1 | * | 9/2008 | Hayashi et al. | 219/444.1 |

FOREIGN PATENT DOCUMENTS

JP   2002-134489   5/2002

* cited by examiner

*Primary Examiner* — Joseph M Pelham
(74) *Attorney, Agent, or Firm* — Oblon, Spivak, McClelland, Maier & Neustadt, L.L.P.

(57) ABSTRACT

A substrate processing apparatus of which through holes in a mounting stage can be properly sealed. A substrate processing apparatus comprises a plate-like mounting stage having a plurality of first through holes, a base member including a plurality of second through holes that have female thread portions, a plurality of pin-shaped members being passed through and fitted into the first and second through holes and including flange portions, a plurality of sealing surfaces, and a plurality of sealing members disposed such as to enclose openings of the first through holes. One ends of the pin-shaped members project out from the sealing surfaces, and the other ends have male thread portions capable of engaging with female thread portions of the base member. When the base member moves away from the mounting stage, an end of each of the female thread portions comes into abutment with an end of each of the male thread portions.

7 Claims, 6 Drawing Sheets

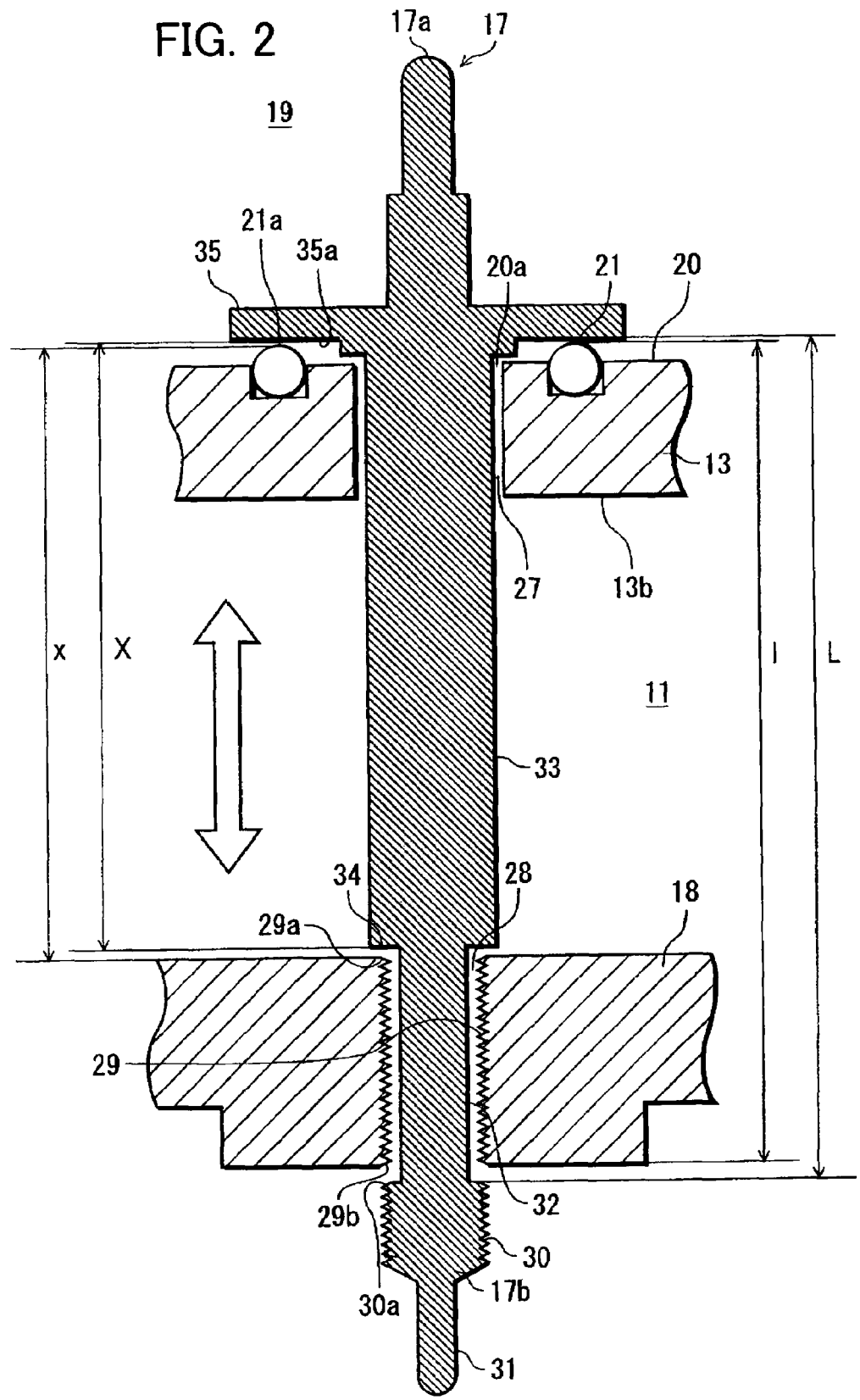

SUBSTRATE PROCESSING APPARATUS

BACKGROUND OF THE INVENTION

1. Field of the Invention

The present invention relates to a substrate processing apparatus, and in particular to a substrate processing apparatus having a plurality of pusher pins that lift up and lower a substrate.

2. Description of the Related Art

As shown in FIG. 5, there is known a substrate processing apparatus 52 that has a processing chamber (not shown) in which a wafer W as a substrate is housed and the wafer W is subjected to predetermined processing, a stage 50 that is disposed inside the processing chamber and on which the wafer W is mounted, and a plurality of pusher pins 51 that can be made to project out from the stage 50. The pusher pins 51 are rod-like members penetrating through the stage 50 and disposed on an arm 53 disposed below the stage 50. The arm 53 is moved upward and downward by a motor 54. Thus, the pusher pins 51 are also moved upward and downward (see, for example, Japanese Laid-Open Patent Publication (Kokai) No. 2002-134489).

As methods of disposing the pusher pins 51 on the arm 53, there are known a method in which the pusher pins 51 are fixed to the arm 53 (hereinafter referred to merely as the "fixing method"), and a method in which the pusher pins 51 are supported by the arm 53 without being fixed to the arm 53 (hereinafter referred to merely as the "supporting method"). In the fixing method, the upward/downward movement of the pusher pins 51 is restricted by the arm 53. In the supporting method, the upward movement of the pusher pins 51 is restricted by the arm 53, but the downward movement of the pusher pins 51 is not restricted by the arm 53, and the pusher pins 51 move down under their own weight or the like.

In recent years, there may be a case where a pressure difference is produced in the processing chamber. Specifically, there may be a case where the pressure above the stage 50 is higher than the pressure below the stage 50. In this case, to prevent gas above the stage 50 from leaking to below the stage 50 via the pin through holes 55 of the stage 50 to eliminate the pressure difference, the pin through holes 55 have to be sealed. In general, to seal each pin through hole 55, an O-ring is disposed in a part of the pusher pin 51 which is housed in the pin through hole 55, and hence the O-ring is interposed between a side face of the pin through hole 55 and a side face of the pusher pin 51.

However, when the stage 50 has a heater incorporated therein, and the heater heats the wafer W, the above-mentioned gap may be narrowed due to a difference in the amount of thermal expansion between the stage 50 and the arm 53, causing the O-ring to be excessively compressed. Once the O-ring has been excessively compressed, it cannot restore, and as a result, cannot seal the pin through hole 55.

In recent years, a method in which a pin through hole is sealed without providing an O-ring in the above-mentioned gap has thus been studied. Specifically, as shown in FIG. 6, a flange 60a is formed part way along a pusher pin 60 in a manner extending vertically to the direction in which the pusher pin 60 moves upward and downward, and on the other hand, a stage is provided with a seal surface 61 parallel to the flange 60a, and an O-ring 62 is disposed on the seal surface 61.

In this method, when the pusher pin 60 has moved down, the flange 60a comes into abutment with the O-ring 62 and compresses the O-ring 62. Therefore, a gap between the flange 60a and the seal surface 61 is sealed, and as a result, a pin through hole 63 is sealed.

However, in the method of FIG. 6, when the pusher pin 60 is fixed to an arm 64, the O-ring 62 may be excessively compressed or not be compressed due to a difference in the amount of thermal expansion between the pusher pin 60 and the stage in the vertical direction as viewed in the drawing, and hence the pin through hole 63 may not be properly sealed.

Moreover, when the pusher pin 60 is supported by the arm 64 without being fixed to the arm 64, the downward movement of the pusher pin 60 is not restricted by the arm 64, and hence, when the pusher pin 60 comes into abutment with the side face of the pin through hole 63, the pusher pin 60 does not move down. Also, the failure of the pusher pin 60 to move down cannot be detected. If the pusher pin 60 does not move down, the O-ring 62 is not compressed, and hence the pin through hole 63 cannot be properly sealed.

SUMMARY OF THE INVENTION

The present invention provides a substrate processing apparatus of which through holes in a mounting stage can be properly sealed.

Accordingly, in the present invention, there is provided a substrate processing apparatus comprising a processing chamber having therein a first space for housing a substrate, a plate-shaped mounting stage that is disposed in the first space and on which the substrate is mounted, a cover member capable of coming into abutment with a substrate mounting surface of the mounting stage on which the substrate is mounted, a gas supply portion connected to the cover member, a plurality of pin-shaped members that can be made to project out from the substrate mounting surface and support the substrate, a base member that is disposed in the first space and on an opposite side of the substrate mounting surface and is movable toward the mounting stage, a plurality of sealing surfaces that are formed such as to face the substrate mounted on the mounting stage, and a plurality of sealing members disposed on the sealing surfaces, wherein the cover member defines a second space between the covering member and the substrate mounting surface when the cover member comes into abutment with the substrate mounting surface, the gas supply portion supplies gas into the second space so that a pressure in the second space becomes higher than a pressure in the first space, the mounting stage comprises a plurality of first through holes penetrating therethrough from a surface opposite to the substrate mounting surface to the sealing surfaces, and the sealing members are disposed such as to enclose openings of the first through holes opened to the sealing surfaces, the base member comprises a plurality of second through holes that penetrate through the base member in a moving direction of the base member and have female thread portions on respective sides thereof, the second through holes facing the first through holes, the pin-shaped members are passed through and fitted into the first through holes and the second through holes facing the first through holes, one ends of the pin-shaped members projecting out from the sealing surfaces, and the other ends of the pin-shaped members having male thread portions capable of engaging with the female thread portions of the second through holes, the male thread portions being positioned on a side of the base member opposite to the mounting stage without engaging with the female thread portions, when the base member moves closer to the mounting stage, the pin-shaped members engage with the base member and move closer to the substrate with the movement of the base member, the pin-shaped members comprise flange portions extending vertically to a moving direction of the pin-shaped members at parts projecting out from each of the sealing surfaces, the flange portions being capable of separating from the sealing members with movement of the pin-shaped members, and when the base member moves away from the mounting stage after the flange portions and the sealing members separate from each other, an end of each of the female thread portions on the male thread portion side comes into abutment with an end of each of the male thread portions on the female thread portion side.

According to the present invention, the mounting stage has the sealing surfaces facing the substrate mounted on the mounting stage and the first through holes opened in the sealing surfaces, the base member movable toward the mounting stage has the second through holes facing the first through holes, the female thread portions are formed on the side faces of the second through holes, the pin-shaped members passed through and fitted into the first through holes and the second through holes have the male thread portions disposed on the side of the base member opposite to the mounting stage, and when the base member moves away from the mounting stage after the flange portions of the pin-shaped members and the sealing members disposed such as to enclose the opening of the sealing surfaces separate from each other, the ends of the female thread portions of the second through holes on the male thread portion side come into abutment with the ends of the male thread portions of the pin-shaped members on the female thread portion side. Therefore, the pin-shaped members engage with the base member and are forced to move away from the mounting stage by the base member moving away from the mounting stage, and the flange portions of the pin-shaped members move closer to the sealing members. Thus, the pin-shaped members can be prevented from failing to move, and the flange portions of the pin-shaped members can be prevented from failing to move toward the sealing members. As a result, the flange portions of the pin-shaped members can be reliably brought into abutment with the sealing members. The sealing members with which the flange portions have been brought into abutment are compressed to seal the gaps between the flange portions and the sealing surfaces. As a result, gas can be prevented from flowing into the first through holes via the gaps between the flange portions and the sealing surfaces, and hence the through holes in the mounting stage can be property sealed.

The present invention can provide a substrate processing apparatus, wherein a first distance from an end of the flange portion on the sealing member side to the end of the male thread portion on the female thread portion side is longer than a second distance from an end of the sealing member on the flange portion side to the end of the female thread portion on the male thread portion side irrespective of a position of the base member.

According to the present invention, irrespective of the position of the base member, the first distance from the ends of the flange portions on the sealing member side to the ends of the male thread portions on the female thread portion side is longer than the second distance from the ends of the sealing members on the flange portion side to the ends of the female thread portions on the male thread portion side. Thus, while the male thread portions are in engagement with the female thread portions at the time of mounting or the like, the rotating flange portions and the sealing members do not come into abutment with each other, and hence the sealing members are not worn out or deformed by the flange portions. Moreover, while the pin-shaped members are forced to move away from the substrate, the flange portions and the sealing members do not come into abutment with each other, and hence the sealing members are not forced to be excessively compressed. Therefore, impairment of the sealing function of the sealing members can be prevented, and hence the through holes in the mounting stage can be properly sealed.

The present invention can provide a substrate processing apparatus, wherein the mounting stage comprises a heating element that heats the substrate, and irrespective of whether the heating element generates heat, the following condition is satisfied, the first distance−the second distance>0.

According to the present invention, the following condition, the first distance−the second distance>0, is satisfied irrespective of whether the heating element generates heat or not. Thus, even if the mounting stage, the pin-shaped members, and the base member are thermally expanded due to heat generation of the heating element, while the male thread portions are in engagement with the female thread portions at the time of mounting or the like, the rotating flange portions and the sealing members do not come into abutment with each other, and also, while the pin-shaped members are forced to move away from the substrate, the flange portions and the sealing members do not come into abutment with each other. As a result, even if the heating element generates heat, impairment of the sealing function of the sealing members can be reliably prevented.

The present invention can provide a substrate processing apparatus, wherein the pin-shaped member comprises a thin neck portion that is to be loosely fitted into the second through hole, and irrespective of whether the heating element generates heat, a diameter of the thin neck portion is smaller than an inner diameter of the female thread portion.

According to the present invention, because irrespective of whether the heating element generates heat or not, the diameter of the thin neck portions of the pin-shaped members that are loosely fitted into the second through holes of the base member is smaller than the inner diameter of the female thread portions, the thin neck portions of the pin-shaped members and the female thread portions of the second through holes do not come into abutment with each other even if the pin-shaped members and the base member are thermally expanded due to heat generation of the heating element. Therefore, the pin-shaped members can be prevented from tipping over to tilt the flange portions through abutment of the thin neck portions and the female thread portions, and hence the sealing members can be prevented from not being properly compressed. As a result, even if the pin-shaped members and the base member are thermally expanded, the through holes in the mounting stage can be properly sealed.

The present invention can provide a substrate processing apparatus, wherein a diameter of the stage through holes is larger than an outer diameter of the male thread portion.

According to the present invention, because the diameter of the first through holes in the mounting stage is larger than the outer diameter of the male thread portions, the male thread portions of the pin-shaped members can pass through the first through holes from the sealing surface side to the side opposite to the substrate mounting surface. The male thread portions having passed through the first through holes engages with the female thread portions of the second through holes and further move to reach the side of the base member opposite to the mounting stage. Therefore, without moving, disassembling, or removing the mounting stage and the base member, the pin-shaped members can be passed through and fitted into the first through holes and the second through holes, and hence the pin-shaped members can be easily mounted on the mounting stage and the base member. Moreover, the male thread portions having moved from the side of the base member opposite to the mounting stage to the mounting stage side of the base member via the second through holes can pass through the first through holes from the side opposite to the substrate mounting surface to the sealing surface side. Therefore, without moving, disassembling, or removing the mounting stage and the base member, the pin-shaped members can be easily demounted from the mounting stage and the base member.

The present invention can provide a substrate processing apparatus, wherein the pin-shaped member has a thin portion at a distal end of the male thread portion.

According to the present invention, because each of the pin-shaped members has the thin portion at the distal end of the male thread portion, the thin portion functions as guides in passing the male thread portion through the first through hole from the sealing surface side to the side opposite to the substrate mounting surface and engaging the male thread portion with the female thread portion of the second through hole. Therefore, the pin-shaped members can be more easily mounted on the mounting stage and the base member.

The present invention can provide a substrate processing apparatus, wherein a tapered portion reduced in diameter toward the female thread portion is formed at an end of the male thread portion on the female thread portion side.

According to the present invention, because the tapered portion reduced in diameter toward the female thread portion is formed at the end of each of the male thread portions on the female thread portion side, the tapered portion functions as a guide when the male thread portion moves from the side of the base member opposite to the mounting stage to the mounting stage side of the base member via the second through hole. Therefore, the pin-shaped members can be easily demounted from the mounting stage and the base member.

The above and other objects, features, and advantages of the invention will become more apparent from the following detailed description taken in conjunction with the accompanying drawings.

BRIEF DESCRIPTION OF THE DRAWINGS

FIG. 2 is an enlarged sectional view showing the construction of a pusher pin and its vicinity appearing in FIG. 1;

DETAILED DESCRIPTION OF THE PREFERRED EMBODIMENTS

The present invention will now be described in detail with reference to the drawings showing a preferred embodiment thereof.

Figure 1:
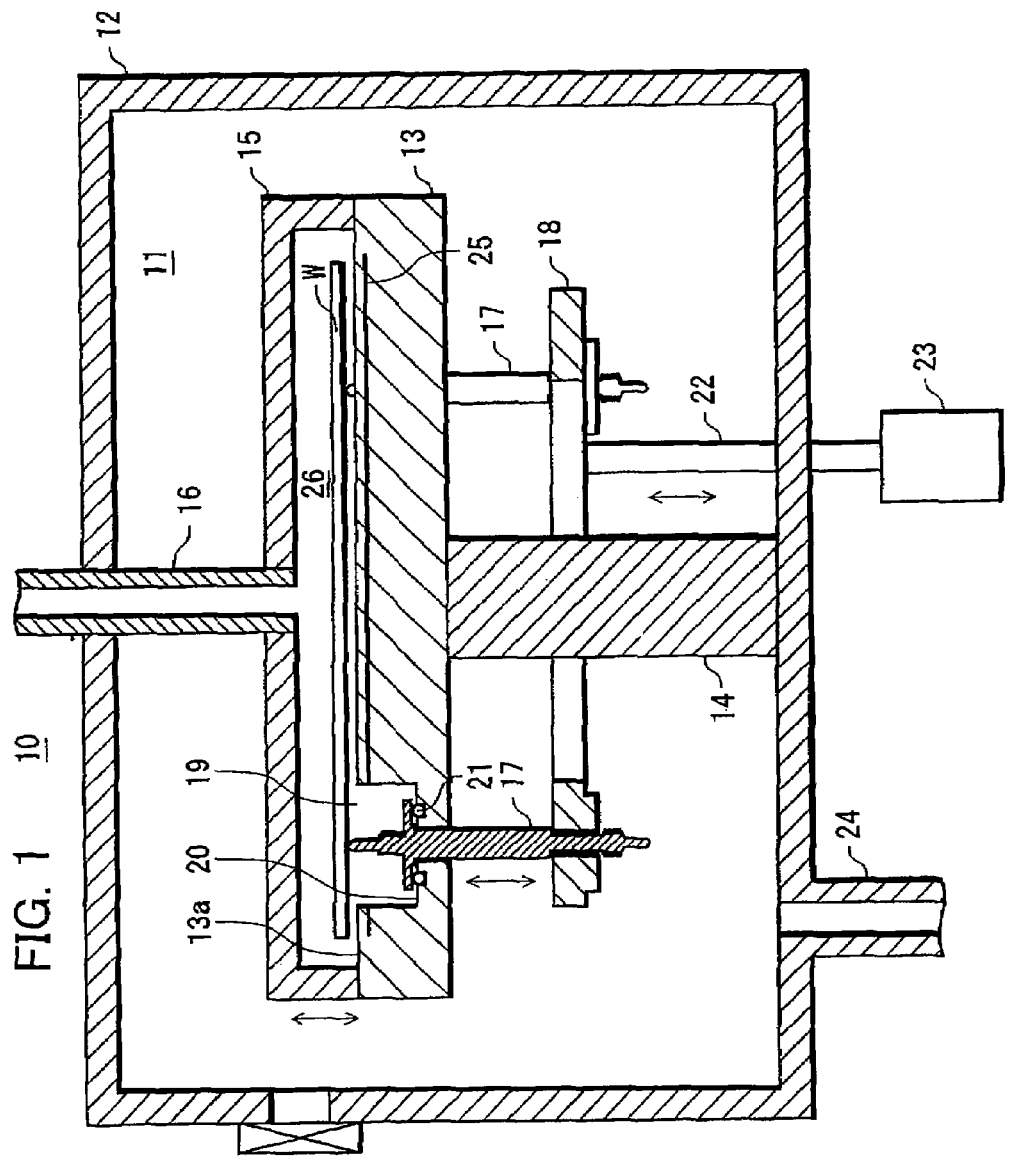
FIG. 1 is a sectional view schematically showing the construction of a substrate processing apparatus according to an embodiment of the present invention.

FIG. 1 is a sectional view schematically showing the construction of a substrate processing apparatus according to an embodiment of the present invention.

As shown in FIG. 1, the substrate processing apparatus 10 has a chamber 12 (processing chamber) having an internal space 11 (first space) in which a semiconductor wafer W (hereinafter referred to merely as a "wafer W") is housed, a disk-shaped stage 13 (mounting stage) that is disposed in the internal space 11 and on which the wafer W is mounted, a stem 14 that is installed in a lower part of the chamber 12 in a standing manner and supports the stage 13, an enclosure 15 (cover member) that is disposed such as to face a surface 13a (substrate mounting surface) of the stage 13 on which the wafer W is mounted (hereinafter referred to as the "wafer mounting surface 13a"), a processing gas supply pipe 16 (gas supply portion) connected to the enclosure 15, three round rod-shaped pusher pins 17 (pin-shaped members) that can be made to project out from the wafer mounting surface 13a and support the wafer W, a base arm 18 (base member) that is disposed in the internal space 11 and on the opposite side of the wafer mounting surface 13a of the stage 13, i.e. below the stage 13 as viewed in the drawing, three concave portions 19 formed in the stage 13 and opened in the wafer mounting surface 13a, three seal surfaces 20 (sealing surfaces) that are formed at the bottom of the respective concave portions 19 such as to face the wafer W mounted on the wafer mounting surface 13a, three O-rings 21 (sealing members) that are disposed in the respective seal surfaces 20, a rod 22 that supports the base arm 18, a rod driving unit 23 that moves the rod 22 vertically as viewed in the drawing, and an exhaust port 24 through which gas is discharged from the internal space 11.

The stage 13 has a heater 25 (heating element) incorporated therein, and the heater 25 heats the mounted wafer W.

The enclosure 15 is a cover member. The enclosure 15 is constructed such as to be movable toward the stage 13 in the vertical direction as viewed in the drawing and hence, the enclosure 15 is able to come into abutment with the wafer mounting surface 13a. When an edge portion of the enclosure 15 comes into abutment with the wafer mounting surface 13a, the enclosure 15 covers the wafer mounting surface 13a to define a processing space 26 (second space) between the enclosure 15 and the wafer mounting surface 13a.

The processing gas supply pipe 16 is opened to the enclosure 15 such as to face the processing space 26 and supplies a processing gas such as silane-based gas into the processing space 26. At this time, the pressure in the processing space 26 is set to be higher than the pressure in the internal space 11 which has been reduced through the exhaust port 24.

The base arm 18 moves vertically as viewed in the drawing in response to vertical movement of the rod 22 and hence is movable toward the stage 13. Moreover, the base arm 18 is an annular or C-shaped member, and the three pusher pins 17 are disposed at regular intervals in a circumferential direction of the base arm 18. The engagement of the base arm 18 and the pusher pins 17 will be described later in detail.

In the substrate processing apparatus 10, when a wafer W of which Low-k film has been damaged is transferred into the internal space 11 and mounted on the wafer mounting surface 13a of the stage 13, the enclosure 15 defines the processing space 26 between the wafer mounting surface 13a and the enclosure 15, the processing gas supply pipe 16 supplies silane-based gas into the processing space 26, and the heater 25 heats the wafer W. At this time, the damaged Low-k film reacts with the silane-based gas and restores.

After the enclosure 15 separates from the stage 13, the wafer W of which damaged Low-k film has been restored is lifted up by the three pusher pins 17 and transferred out from the internal space 11 by an arm or the like that has entered the internal space 11 from outside.

FIG. 2 is an enlarged sectional view showing the construction of the pusher pin and its vicinity appearing in FIG. 1. It should be noted that the vertical direction in FIG. 2 (indicated by an outline arrow) is the same as the vertical direction in FIG. 1, and in the substrate processing apparatus 10, each of the three pusher pins 17 has a construction illustrated in FIG. 2.

As shown in FIG. 2, the stage 13 has a stage through hole 27 (first through holes) as a cylindrical hole penetrating through the stage 13 from a surface (hereinafter referred to as the "stage lower surface") 13b opposite to the wafer mounting surface 13a to the seal surface 20. The stage through hole 27 is formed in the vertical direction as viewed in the drawing. The diameter of the stage through hole 27 is set to be larger than the outer diameter of a male thread portion 30, described later, of the pusher pin 17 and the diameter of a thick neck portion 33, described later, of the pusher pin 17.

The O-ring 21 is disposed on the seal surface 20 of the concave portion 19 so as to enclose an opening 20a of the stage through hole 27. Moreover, the O-ring 21 is disposed concentrically with the opening 20a. Here, since the concave portion 19 is opened to the wafer mounting surface 13a, the pressure in the concave portion 19 becomes equal to the pressure in the processing space 26 when the enclosure 15 defines the processing space 26 between the wafer mounting surface 13a and the enclosure 15.

The base arm 18 has an arm through hole 28 (second through hole) penetrating through the base arm 18 in the direction in which the base arm 18 moves upward and downward. The arm through hole 28 is formed such as to face the stage through hole 27, and hence the base arm 18 has a total of three arm through holes 28. Moreover, since the direction in which the base arm 18 moves upward and downward is the same as the vertical direction as viewed in the drawing, the arm through hole 28 is coaxial with the stage through hole 27.

A female thread portion 29 is formed on a side face of the arm through hole 28 in the vertical direction as viewed in the drawing. The inner diameter of the female thread portion 29 is larger than the diameter of a thin neck portion 32, described later, of the pusher pin 17, and the length of the female thread portion 29 is shorter than that of the thin neck portion 32.

As shown in FIG. 2, the pusher pin 17 is passed through and fitted into the stage through hole 27, and the arm through hole 28 facing the stage through hole 27. When the pusher pin 17 is passed through and fitted into the stage through hole 27 and the arm through hole 28, an upper end 17a (one end) of the pusher pin 17 in FIG. 2 projects out from the seal surface 20. The upper end 17a is formed to be hemispherical. Moreover, the pusher pin 17 has a lower end 17b having the male thread portion 30 that can engage with the female thread portion 29 of the arm through hole 28. When the pusher pin 17 is passed through and fitted into the stage through hole 27 and the arm through hole 28, the male thread portion 30 is positioned below the female thread portion 29 without engaging with the female thread portion 29. That is, the male thread portion 30 is positioned on the side of the base arm 18 opposite to the stage 13.

The pusher pin 17 has a thin guide portion 31 (thin portion) at a distal end thereof below the male thread portion 30, and also has the thin neck portion 32 above the male thread portion 30. As described above, the diameter of the thin neck portion 32 is set to be smaller than the inner diameter of the female thread portion 29.

Also, the pusher pin 17 has the thick neck portion 33 formed above the thin neck portion 32 and extending to a flange 35, described later. Therefore, a step 34 is formed at a boundary between the thick neck portion 33 and the thin neck portion 32. The diameter of the thick neck portion 33 is set to be larger than the inner diameter of the female thread portion 29. Thus, when the base arm 18 moves closer to the stage 13 (upward as viewed in the drawing), an end 29a of the female thread portion 29 on the stage 13 side comes into abutment with the step 34. As a result, the pusher pin 17 engages with the base arm 18 and moves closer to the stage 13 (upward as viewed in FIG. 2) as the base arm 18 moves upward as viewed in the drawing. Therefore, the upper end 17a of the pusher pin 17 projects out from the concave portion 19 to lift the wafer W upward as viewed in the drawing.

Further, as shown in FIG. 2, a part of the pusher pin 17 which projects out from the seal surface 20 has the flange 35 (flange portion) extending out vertically to the direction in which the pusher pin 17 moves upward as viewed in the drawing. The flange 35 is a disk-shaped flange member with the central axis of the pusher pin 17 at the nucleus, and the diameter of the flange 35 is larger than that of the O-ring 21. Moreover, the flange 35 is formed so as to become substantially parallel to the seal surface 20 when the pusher pin 17 is passed through and fitted into the stage through hole 27 and the arm through hole 28.

In the substrate processing apparatus 10, when the base arm 18 is positioned at the lowermost part of its movable range in the vertical direction as viewed in the drawing, the distance X from a lower surface 35a of the flange 35 which faces the O-ring 21 (i.e. an end on the sealing member side) to the step 34 is set to be smaller than the distance x from an end 21a of the O-ring 21 on the flange 35 side to the end 29a of the female thread portion 29 on the stage 13 side. Therefore, when the base arm 18 is positioned at the lowermost part of its movable range, and the pusher pin 17 is passed through and fitted into the stage through hole 27 and the arm through hole 28, the pusher pin 17 moves downward as viewed in the drawing under its own weight, and at this time, because the distance X is set to be smaller than the distance x, the lower surface 35a of the flange 35 comes into abutment with the end 21a of the O-ring 21 before the step 34 comes into abutment with the end 29a of the female thread portion 29. As a result, the O-ring 21 is compressed under the weight of the pusher pin 17 to seal the gap between the flange 35 and the seal surface 20.

Here, the pressure in the concave portion 19 is equal to the pressure in the processing space 26, and the stage through hole 27 that communicates with the gap between the flange 35 and the seal surface 20 is opened in the stage lower surface 13b, that is, opened toward the internal space 11. Moreover, because the pressure in the processing space 26 is higher than the pressure in the internal space 11, there may be a case where the silane-based gas supplied into the processing space 26 enters the concave portion 19 and leaks into the internal space 11 via the gap between the flange 35 and the seal surface 20 as well as the stage through hole 27. In this case, however, because the O-ring 21 seals the gap between the flange 35 and the seal surface 20, the silane-based gas can be prevented from flowing into the stage through hole 27 via the gap between the flange 35 and the seal surface 20.

Moreover, because the flange 35 is formed in the pusher pin 17, the flange 35 moves integrally with the pusher pin 17. Thus, when the pusher pin 17 moves upward as viewed in the drawing, the flange 35 separates from the O-ring 21, and when the pusher pin 17 moves downward as viewed in the drawing, the flange 35 comes into abutment with the O-ring 21. That is, the flange 35 is able to separate from the O-ring 21 in accordance with movement of the pusher pin 17.

In the substrate processing apparatus 10, when the pusher pin 17 is caused to move downward as viewed in the drawing merely under its own weight after the pusher pin 17 moves upward as viewed in the drawing and the flange 35 separates from the O-ring 21, there may be a case where the pusher pin 17 tilts, and the thick neck portion 33 comes into abutment with a side face of the stage through hole 27, so that the pusher pin 17 does not move downward as viewed in the drawing. If the pusher pin 17 does not move downward as viewed in the drawing, the flange 35 does not come into abutment with the O-ring 21, and hence the O-ring 21 cannot seal the gap between the flange 35 and the seal surface 20, causing the silane-based gas to flow into the stage through hole 27 via the gap between the flange 35 and the seal surface 20 and leak into the internal space 11. To cope with this, in the present embodiment, when the base arm 18 moves downward as viewed in the drawing, the base arm 18 forces the pusher pin 17 to move downward as viewed in the drawing.

Moreover, during the forced downward movement of the pusher pin 17 as viewed in the drawing, when the flange 35 comes into abutment with the O-ring 21, the O-ring 21 may be forced to be excessively compressed, and the sealing function of the O-ring 21 may be impaired. To cope with this, in the present embodiment, the substrate processing apparatus 10 has the following construction. Specifically, when the base arm 18 is positioned at the lowermost part of its movable range in the vertical direction as viewed in the drawing, the distance L (first distance) from the lower surface 35a of the flange 35 to an end 30a of the male thread portion 30 on the female thread portion 29 side is set to be longer than the distance l (second distance) from the end 21a of the O-ring 21 to an end 29b of the female thread portion 29 on the male thread portion 30 side.

FIGS. 3A, 3B, 3C, 3D, and 3E are process drawings showing how the pusher pin in FIG. 2 is forced to move. It should be noted that the vertical direction in FIGS. 3A, 3B, 3C, 3D, and 3E as well is the same with the vertical direction in FIG. 2.

Figure 3A:
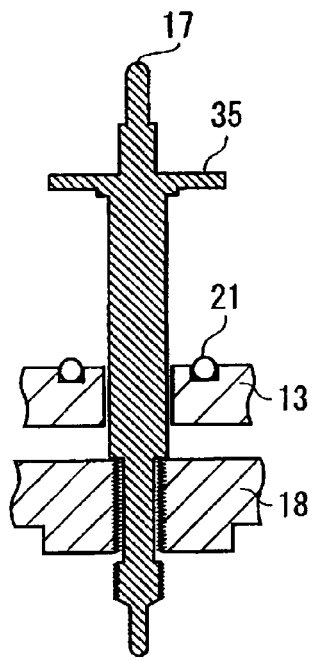
FIGS. 3A, 3B, 3C, 3D, and 3E are process drawings showing how the pusher pin in FIG. 2 is forced to move.

First, with upward movement of the base arm 18 as viewed in the drawing, the pusher pin 17 moves upward as viewed in the drawing. At this time, the flange 35 separates from the O-ring 21 (FIG. 3A).

Figure 3B:
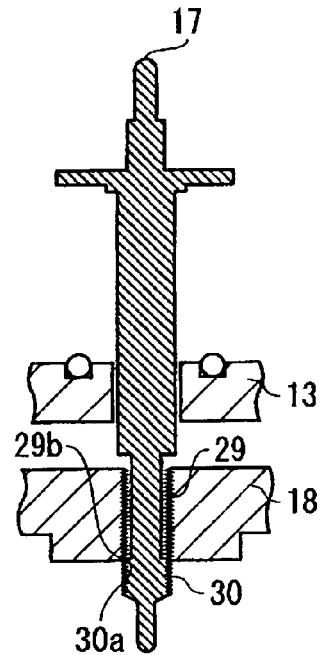
Figure 3C:
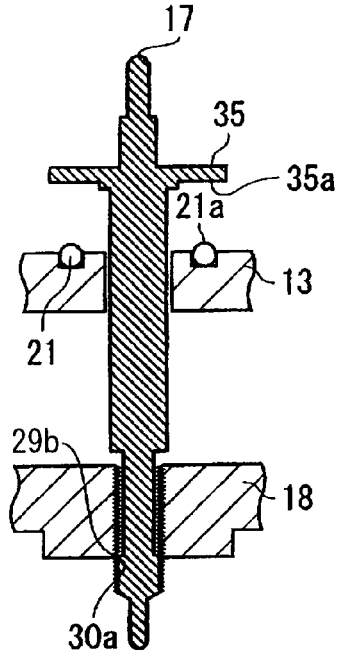

Next, the base arm 18 starts moving downward as viewed in the drawing. Here, because the male thread portion 30 is positioned below the female thread portion 29 without engaging with the female thread portion 29 as described above, the end 29b of the female thread portion 29 comes into abutment with the end 30a of the male thread portion 30 (FIG. 3B). As a result, the pusher pin 17 engages with the base arm 18 and is forced to move away from the stage 13 (downward as viewed in the drawing) with downward movement of the base arm 18 as viewed in the drawing (FIG. 3C). Then, the base arm 18 reaches the lowermost part of its movable range in the vertical direction as viewed in the drawing (FIG. 3D).

Figure 3D:
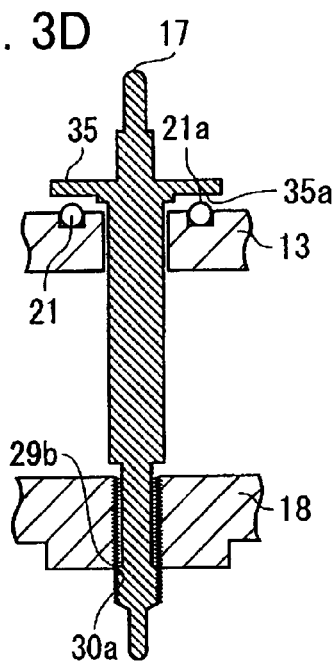

While the pusher pin 17 is forced to move downward as viewed in the drawing, the end 29b of the female thread portion 29 continues to be in abutment with the end 30a of the male thread portion 30 (FIGS. 3C and 3D). That is, the position of the end 20b of the female thread portion 29 corresponds to the position of the end 30a of the male thread portion 30. Here, because the distance L in FIG. 2 is set to be longer than the distance l in FIG. 2 as described above, the distance from the end 29b of the female thread portion 29 (the end 30a of the male thread portion 30) to the lower surface 35a of the flange 35 is maintained longer than the distance from the end 29b of the female thread portion 29 (the end 30a of the male thread portion 30) to the end 21a of the O-ring 21.

Thus, while the pusher pin 17 is forced to move downward as viewed in the drawing, the flange 35 never comes into abutment with the O-ring 21.

Figure 3E:
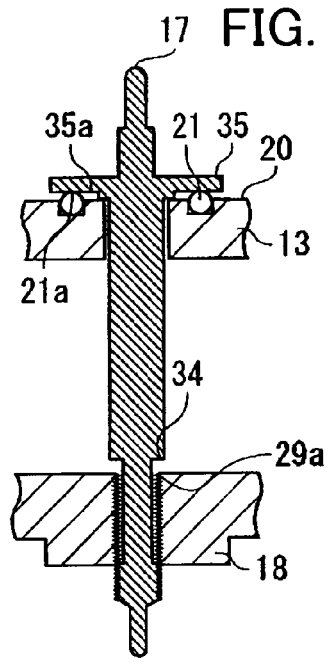

After that, the pusher pin 17 moves downward as viewed in the drawing under its own weight, but because the distance X in FIG. 2 is set to be shorter than the distance x in FIG. 2 as described above, the lower surface 35a of the flange 35 comes into abutment with the end 21a of the O-ring 21 before the step 34 comes into abutment with the end 29a of the female thread portion 29 (FIG. 3E). As a result, the O-ring 21 seals the gap between the flange 35 and the seal surface 20.

Moreover, in the substrate processing apparatus 10, because the diameter of the stage through hole 27 is set to be larger than the outer diameter of the male thread portion 30 of the pusher pin 17 as described above, the male thread portion 30 can be passed through the stage through hole 27. Also, the male thread portion 30 is able to engage with the female thread portion 29. Thus, at the time of mounting the pusher pin 17 on the stage 13 and the base arm 18, the pusher pin 17 can be passed through and fitted into the stage through hole 27 and the arm through hole 28 in a downward direction as viewed in FIG. 2.

At the time of mounting the pusher pin 17 on the stage 13 and the base arm 18, the pusher pin 17 rotates when the male thread portion 30 engages with the female thread portion 29. If the rotating flange 35 comes into abutment with the O-ring 21, the O-ring 21 may be worn out or deformed by the rotating flange 35, and as a result, the sealing function of the O-ring 21 may be impaired. To cope with this, in the present embodiment, the distance L in FIG. 2 is set to be longer than the distance l in FIG. 2.

FIGS. 4A, 4B, 4C, 4D, and 4E are process drawings showing how the pusher pin in FIG. 2 is mounted on the stage and the base arm. It should be noted that the vertical direction in FIGS. 4A, 4B, 4C, 4D, and 4E as well is the same as the vertical direction in FIG. 2.

Figure 4A:
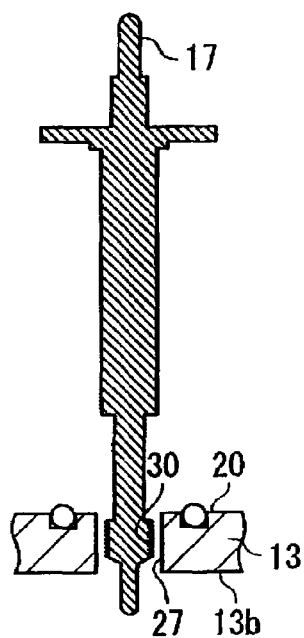
FIGS. 4A, 4B, 4C, 4D, and 4E are process drawings showing how the pusher pin in FIG. 2 is mounted on a stage and a base arm.

First, the pusher pin 17 is passed through the stage through hole 27 from above as viewed in the drawing (FIG. 4A). At this time, because the diameter of the stage through hole 27 is set to be larger than the outer diameter of the male thread portion 30, the male thread portion 30 can pass through the stage through hole 27 from the seal surface 20 side to the stage lower surface 13b side.

Figure 4B:
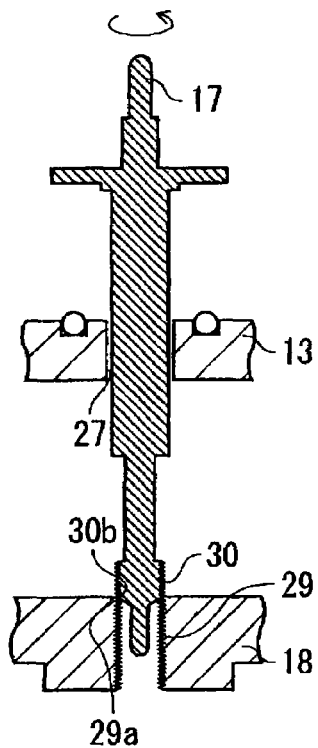
Figure 4C:
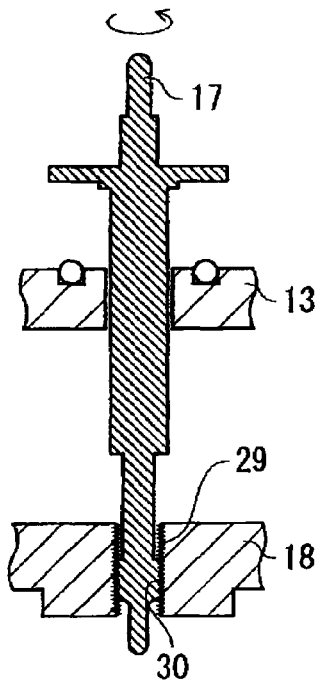

The male thread portion 30 having passed through the stage through hole 27 moves downward as viewed in the drawing, and a lower end 30b of the male thread portion 30 comes into abutment with the end 29a of the female thread portion 29 of the base arm 18 (FIG. 4B). After that, the male thread portion 30 moves downward as viewed in the drawing while engaging with the female thread portion 29 (FIG. 4C), and then the end 30a of the male thread portion 30 separates from the end 29b of the female thread portion 29 (FIG. 4D).

Figure 4D:

While the pusher pin 17 and the flange 35 are rotating, the flange 35 becomes closest to the O-ring 21 when the end 30a of the male thread portion 30 separates from the end 29b of the female thread portion 29 (FIG. 4D). At this time, the position of the end 29b of the female thread portion 29 corresponds to the position of the end 30a of the male thread portion 30. Here, because the distance L in FIG. 2 is set to be longer than the distance l in FIG. 2 as described above, the distance from the end 29b of the female thread portion 29 (the end 30a of the male thread portion 30) to the lower surface 35a of the flange 35 is longer than the distance from the end 29b of the female thread portion 29 (the end 30a of the male thread portion 30) to the end 21a of the O-ring 21 at this time.

Thus, even when the flange 35 comes closest to the O-ring 21 while rotating, the flange 35 does not come into abutment with the O-ring 21.

Figure 4E:
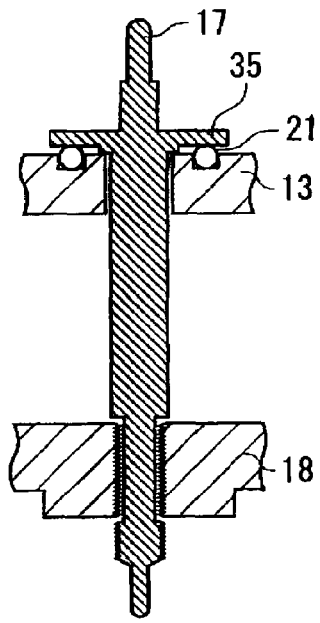
Figure 5:
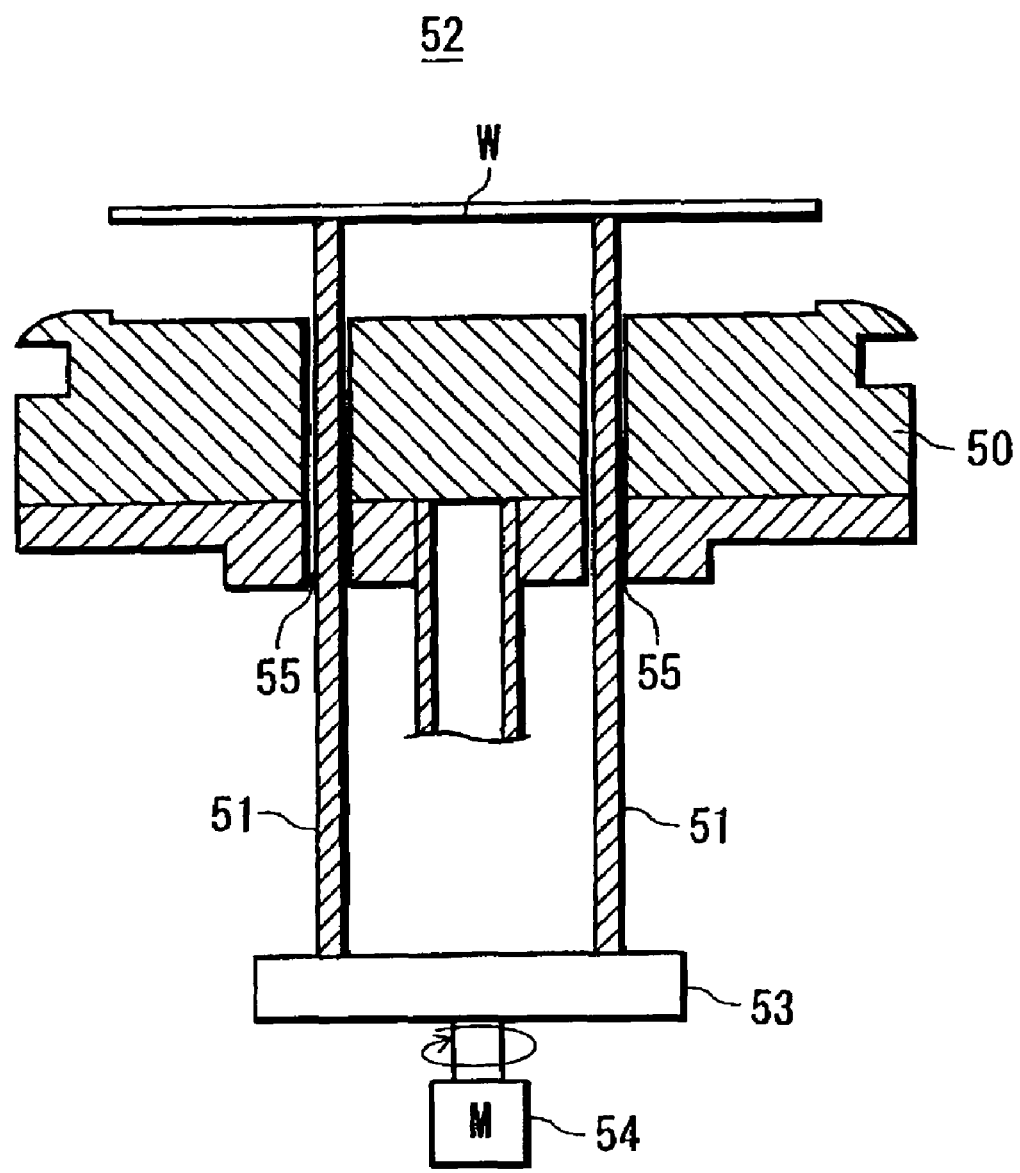
FIG. 5 is a sectional view schematically showing the construction of a conventional substrate processing apparatus.
Figure 6:
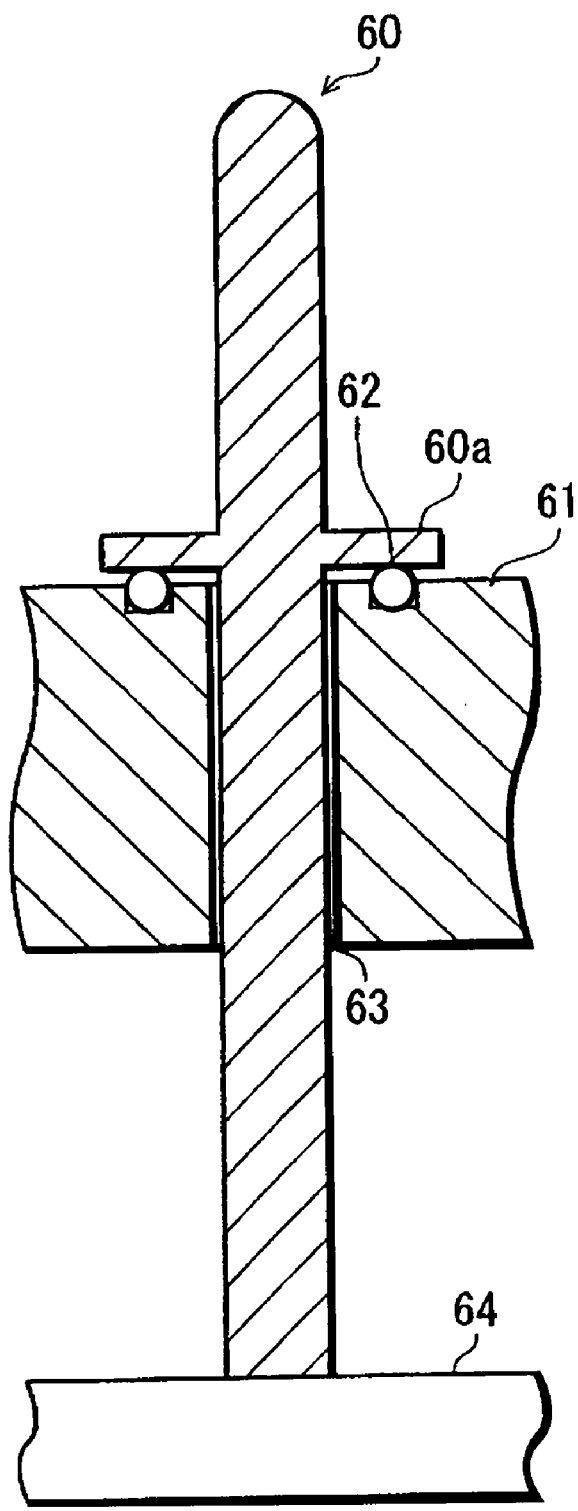
FIG. 6 is an enlarged sectional view showing the construction of a pusher pin in a conventional substrate processing apparatus.

After that, the pusher pin 17 moves downward as viewed in the drawing under its own weight, and as described above, the lower surface 35a of the flange 35 comes into abutment with the end 21a of the O-ring 21 before the step 34 comes into abutment with the end 29a of the female thread portion 29 (FIG. 4E). As a result, the O-ring 21 seals the gap between the flange 35 and the seal surface 20. Then, the male thread portion 30 passes through the arm through hole 28 to reach the side of the base arm 18 opposite to the stage 13.

Moreover, when the pusher pin 17 is to be mounted on the stage 13 and the base arm 18, the guide portion 31 functions as a guide in passing the male thread portion 30 through the stage through hole 27 and engaging the male thread portion 30 with the female thread portion 29. Therefore, the pusher pin 17 can be easily mounted on the stage 13 and the base arm 18.

It should be noted that the end 30a of the male thread portion 30 of the pusher pin 17 may be provided with a tapered portion that is reduced in diameter toward the female thread portion 29. When the pusher pin 17 is to be demounted from the stage 13 and the base arm 18, when the male thread portion 30 moves from the side of the base arm 18 opposite to the stage 13 to the stage 13 side of the base arm 18 via the arm through hole 28, the tapered portion functions as a guide to the arm through hole 28. Therefore, the pusher pin 17 can be easily demounted from the stage 13 and the base arm 18.

Moreover, there is a possibility that after the pusher pin 17 is mounted on the stage 13 and the base arm 18, the heater 25 of the stage 13 generates heat to thermally expand the pusher pin 17, the stage 13 and the base arm 18, causing the distance L and the distance 1 in FIG. 2 to change, and as a result, while the pusher pin 17 is forced to move downward, the flange 35 comes into abutment with the O-ring 21, or when the pusher pin 17 is mounted on the stage 13 and the base arm 18, the rotating flange 35 comes into abutment with the O-ring 21.

To cope with this, in the present embodiment, the distance L and the distance l are set so that the following condition, the distance L–the distance l>0. can be satisfied irrespective of whether the heater 25 generates heat or not. For example, the distance L–the distance l is set to 0.6 mm at room temperature (20° C.). Thus, even if the pusher pin 17, the stage 13, and the base arm 18 are thermally expanded, the flange 35 can be prevented from coming into abutment with the O-ring 21 when the pusher pin 17 is forced to move downward, and when the pusher pin 17 is mounted on the stage 13 and the base arm 18.

Further, there is a possibility that after the pusher pin 17 is mounted on the base arm 18, the heater 25 of the stage 13 generates heat to thermally expand the pusher pin 17 and the base arm 18, and as a result, the thin neck portion 32 of the pusher pin 17 comes into abutment with the female thread portion 29 of the arm through hole 28, and the pusher pin 17 tips over to tilt the flange 35, so that the O-ring 21 cannot be properly compressed.

To cope with this, in the present embodiment, the diameter of the thin neck portion 32 is set to be smaller than the inner diameter of the female thread portion 29 irrespective of whether the heater 25 generates heat or not. Thus, even if the pusher pin 17 and the base arm 18 are thermally expanded, the thin neck portion 32 can be prevented from coming into abutment with the female thread portion 29.

According to the substrate processing apparatus 10 of the present embodiment, the stage 13 has the seal surface 20 and the stage through hole 27 opened to the seal surface 20, the base arm 18 movable toward the stage 13 has the arm through hole 28 facing the stage through hole 27, the female thread portion 29 is formed on the side face of the arm through hole 28, the pusher pin 17 passed through and fitted into the stage through hole 27 and the arm through hole 28 has the male thread portion 30 disposed on the side of the base arm 18 opposite to the stage 13, and when the base arm 18 moves away from the stage 13 after the flange 35 and the O-ring 21 enclosing the opening of the seal surface 20 separate from each other, the end 29b of the female thread portion 29 comes into abutment with the end 30a of the male thread portion 30. Therefore, the pusher pin 17 engages with the base arm 18 and is forced to move away from the wafer W by the base arm 18 moving away from the stage 13, and the flange 35 moves closer to the O-ring 21. Thus, the pusher pin 17 can be prevented from failing to move downward as viewed in FIG. 2, and the flange 35 can be prevented from failing to move toward the O-ring 21. As a result, the flange 35 can be reliably brought into abutment with the O-ring 21. The O-ring 21 with which the flange 35 has been brought into abutment is compressed to seal the gap between the flange 35 and the seal surface 20. As a result, the silane-based gas can be prevented from flowing into the stage through hole 27 via the gap between the flange 35 and the seal surface 20, and hence the through hole in the stage 13 can be property sealed.

In the substrate processing apparatus 10, when the base arm 18 is positioned at the lowermost part of its movable range in the vertical direction as viewed in the drawing, the distance L from the lower surface 35a of the flange 35 to the end 30a of the male thread portion 30 is longer than the distance 1 from the end 21a of the O-ring 21 to the end 29b of the female thread portion 29. Thus, while the male thread portion 30 is in engagement with the female thread portion 29 at the time of mounting or the like, the rotating flange 35 and the O-ring 21 do not come into abutment with each other, and hence the O-ring 21 is not worn out or deformed by the flange 35. Moreover, while the pusher pin 17 is forced to move away from the wafer W, the rotating flange 35 and the O-ring 21 do not come into abutment with each other, and hence the O-ring 21 is not forced to be excessively compressed. Therefore, impairment of the sealing function of the O-ring 21 can be prevented.

Moreover, in the substrate processing apparatus 10, the following condition, the distance L–the distance l>0, is satisfied irrespective of whether the heater 25 generates heat or not. Thus, even if the stage 13, the pusher pin 17, and the base arm 18 are thermally expanded due to heat generation of the heater 25, while the male thread portion 30 is in engagement with the female thread portion 29 at the time of mounting or the like, the rotating flange 35 and the O-ring 21 do not come into abutment with each other, and also, while the pusher pin 17 is forced to move away from the wafer W, the rotating flange 35 and the O-ring 21 do not come into abutment with each other. As a result, even if the heater 25 generates heat, impairment of the sealing function of the O-ring 21 can be reliably prevented.

Further, in the substrate processing apparatus 10, because the diameter of the thin neck portion 32 of the pusher pin 17 is smaller than the inner diameter of the female thread portion 29 irrespective of whether the heater 25 generates heat or not, the thin neck portion 32 and the female thread portion 29 do not come into abutment with each other even if the pusher pin 17 and the base arm 18 are thermally expanded due to heat generation of the heat 25. Therefore, the pusher pin 17 can be prevented from tipping over to tilt the flange 35 through abutment of the thin neck portion 32 and the female thread portion 29, and hence the O-ring 21 can be prevented from not being properly compressed. As a result, even if the pusher pin 17 and the base arm 18 are thermally expanded, the through hole of the stage 13 can be properly sealed.

Moreover, in the substrate processing apparatus 10, because the diameter of the stage through hole 27 is larger than the outer diameter of the male thread portion 30, the male thread portion 30 can pass through the stage through hole 27 from the seal surface 20 side to the stage lower surface 13b side. The male thread portion 30 having passed through the stage through hole 27 engages with the female thread portion 29 of the arm through hole 28 and further moves to reach the side of the base arm 18 opposite to the stage 13. Therefore, without moving, disassembling, or removing the stage 13 and the base arm 18, the pusher pin 17 can be passed through and fitted into the stage through hole 27 and the arm through hole 28, and hence the pusher pin 17 can be easily mounted on the stage 13 and the base arm 18. Moreover, the male thread portion 30 having moved from the side of the base arm 18 opposite to the stage 13 to the stage 13 side of the base arm 18 via the stage through hole 27 can pass through the stage through hole 27 from the stage lower surface 13b side to the seal surface 20 side. Therefore, without moving, disassembling, or removing the stage 13 and the base arm 18, the pusher pin 17 can be easily demounted from the stage 13 and the base arm 18.

It should be noted that the substrates are not limited to being semiconductor wafers W, but rather may instead be any of various glass substrates used in LCDs (Liquid Crystal Displays), FPDs (Flat Panel Displays) or the like.

What is claimed is:

1. A substrate processing apparatus comprising:
a processing chamber having therein a first space for housing a substrate;
a plate-shaped mounting stage that is disposed in the first space and on which the substrate is mounted;
a cover member capable of coming into abutment with a substrate mounting surface of said mounting stage on which the substrate is mounted;
a gas supply portion connected to said cover member;
a plurality of pin-shaped members that can be made to project out from the substrate mounting surface and support the substrate;
a base member that is disposed in the first space and on the side of the substrate mounting stage opposite the substrate mounting surface and is movable toward said mounting stage;
a plurality of sealing surfaces that are formed such as to face the substrate mounted on said mounting stage; and
a plurality of sealing members disposed on said sealing surfaces,
wherein said cover member defines a second space between said covering member and the substrate mounting surface when said cover member comes into abutment with the substrate mounting surface,
said gas supply portion supplies gas into the second space so that a pressure in the second space becomes higher than a pressure in the first space,
said mounting stage comprises a plurality of first through holes penetrating therethrough from a surface opposite to the substrate mounting surface to said sealing surfaces, and said sealing members are disposed such as to surround openings of said first through holes opened to said sealing surfaces,
said base member comprises a plurality of second through holes that penetrate through said base member in a moving direction of said base member and have female thread portions on respective sides thereof, said second through holes facing said first through holes,
said pin-shaped members are passed through and fitted into said first through holes and said second through holes facing said first through holes, one ends of said pin-shaped members projecting out from said sealing surfaces, and the other ends of said pin-shaped members having male thread portions capable of engaging with the female thread portions of the second through holes, the male thread portions being positioned on a side of said base member opposite to said mounting stage without engaging with the female thread portions,
when said base member moves closer to said mounting stage, said pin-shaped members engage with said base member and move closer to the substrate with the movement of said base member,
said pin-shaped members comprise flange portions extending perpendicular to a moving direction of said pin-shaped members at parts projecting out from each of said sealing surfaces, said flange portions being capable of separating from said sealing members with movement of said pin-shaped members, and
when said base member moves away from said mounting stage after said flange portions and said sealing members separate from each other, an end of each of the female thread portions on the male thread portion side comes into abutment with an end of each of the male thread portions on the female thread portion side.

2. A substrate processing apparatus as claimed in claim 1, wherein a first distance from an end of the flange portion on the sealing member side to the end of the male thread portion on the female thread portion side is longer than a second distance from an end of the sealing member on the flange portion side to the end of the female thread portion on the male thread portion side irrespective of a position of said base member.

3. A substrate processing apparatus as claimed in claim 2, wherein
said mounting stage comprises a heating element that heats the substrate, and
irrespective of whether said heating element generates heat, the following condition is satisfied: the first distance−the second distance>0.

4. A substrate processing apparatus as claimed in claim 3, wherein said pin-shaped member comprises a thin neck portion that is to be loosely fitted into said second through hole, and irrespective of whether said heating element generates heat, a diameter of said thin neck portion is smaller than an inner diameter of the female thread portion.

5. A substrate processing apparatus as claimed in claim 1, wherein a diameter of said first through holes is larger than an outer diameter of the male thread portion.

6. A substrate processing apparatus as claimed in claim 5, wherein said pin-shaped member has a thin portion at a distal end of the male thread portion.

7. A substrate processing apparatus as claimed in claim 5, wherein a tapered portion reduced in diameter toward the female thread portion is formed at an end of the male thread portion on the female thread portion side.

* * * * *